United States Patent
Jiang et al.

(10) Patent No.: US 9,395,401 B2
(45) Date of Patent: Jul. 19, 2016

(54) ELECTRICAL CONNECTION ASSEMBLY AND TESTING METHOD THEREOF

(71) Applicant: TPK TOUCH SOLUTIONS (XIAMEN) INC., Xiamen (CN)

(72) Inventors: Yau-Chen Jiang, Hsinchu (TW); Defa Wu, Jinjiang (CN); Jianbin Yan, Putian (CN); Shaoting Lin, Xiamen (CN); Tsai-Kuei Wei, Hsinchu (TW); Xiaoxin Bai, Xiamen (CN); Caijin Ye, Xiamen (CN)

(73) Assignee: TPK Touch Solutions (Xiamen) Inc., Xiamen (CN)

( * ) Notice: Subject to any disclaimer, the term of this patent is extended or adjusted under 35 U.S.C. 154(b) by 380 days.

(21) Appl. No.: 14/019,475

(22) Filed: Sep. 5, 2013

(65) Prior Publication Data

US 2014/0062501 A1 Mar. 6, 2014

(30) Foreign Application Priority Data

Sep. 6, 2012 (CN) .......................... 2012 1 0326367
Jul. 8, 2013 (CN) .......................... 2013 1 0283682

(51) Int. Cl.
*G01R 31/20* (2006.01)
*G01R 31/00* (2006.01)
(Continued)

(52) U.S. Cl.
CPC ............ *G01R 31/04* (2013.01); *G01R 1/07342* (2013.01); *G01R 31/2818* (2013.01); *G01R 31/2889* (2013.01); *G01R 31/026* (2013.01)

(58) Field of Classification Search
CPC .... G01R 31/024; G01R 31/026; G01R 31/04; G01R 31/043; G01R 31/045; G01R 31/2805; G01R 31/2812; G01R 31/2818; G01R 31/2806; G01R 31/2808; G01R 31/2886; G01R 31/2888; G01R 1/07342; G01R 1/07378; G01R 31/2889
USPC ............... 324/538, 537, 500, 754.07, 756.03, 324/756.07, 757.02, 763.01
See application file for complete search history.

(56) References Cited

U.S. PATENT DOCUMENTS 5,854,558 A * 12/1998 Motooka ............ G01R 1/06711
324/756.07
2002/0145437 A1 * 10/2002 Sporck ............... G01R 1/07342
324/754.07

(Continued)

FOREIGN PATENT DOCUMENTS

CN 1548971 11/2004
CN 1548971 A 11/2004

(Continued)

*Primary Examiner* — Hoai-An D Nguyen
(74) *Attorney, Agent, or Firm* — Gokalp Bayramoglu; Paul Bendemire

(57) ABSTRACT

An electrical connection assembly is disclosed. The electrical connection assembly includes a first circuit board and a second circuit board. The first circuit board has a plurality of first signal electrodes and at least one first test electrode, wherein the first signal electrodes and the first test electrode are arranged in a spaced manner on the same side of the first circuit board. The second circuit board has a plurality of second signal electrodes and at least one second test electrode, wherein the second signal electrodes and the second test electrode are arranged in a spaced manner on the same side of the second circuit board, wherein the first signal electrodes are electrically connected to the second signal electrodes and the first test electrode is electrically connected to the second test electrode to form a testing loop.

23 Claims, 5 Drawing Sheets

(51) Int. Cl.
*G01R 31/04* (2006.01)
*G01R 31/28* (2006.01)
*G01R 1/073* (2006.01)
*G01R 31/02* (2006.01)

(56) References Cited

U.S. PATENT DOCUMENTS

2007/0261009 A1* 11/2007 Granicher .......... G01R 1/07385
           324/756.03
2008/0100320 A1* 5/2008 Miller ................ G01R 1/07385
           324/754.03
2008/0157792 A1* 7/2008 Lee .................... G01R 1/07342
           324/754.18
2011/0043239 A1* 2/2011 Tomita ................ G01R 1/0735
           324/756.03

FOREIGN PATENT DOCUMENTS

| CN | 1580793 | 2/2005 |
| CN | 101067640 | 11/2007 |
| CN | 101720171 A | 6/2010 |
| CN | 202815137 | 3/2013 |
| TW | 200827885 | 7/2008 |
| TW | 201003092 | 1/2010 |
| TW | 201126390 | 1/2010 |
| TW | 419982 | 1/2012 |

* cited by examiner

ELECTRICAL CONNECTION ASSEMBLY AND TESTING METHOD THEREOF

BACKGROUND OF THE INVENTION

This Application claims priority of China Patent Application No. 201210326367.3, filed on Sep. 6, 2012 and China Patent Application No. 201310283682.7, filed on Jul. 8, 2013, the entirety of which is incorporated by reference herein.

FIELD OF THE INVENTION

The present disclosure relates to an electrical connection assembly and a testing method thereof.

DESCRIPTION OF THE RELATED ART

FIG. 1 is a cross section view of a connection between a flexible printed circuit board and a touch panel of a conventional touch display device. Please refer to FIG. 1. During the manufacturing process of the touch display device, the flexible printed circuit (FPC) board needs to be connected to the touch panel. In the conventional method for electrically connecting the flexible printed circuit board 100 to the touch panel 200, an anisotropic conductive film (ACF) 300 is arranged between the electrodes 101 of the flexible printed circuit board 100 and the electrodes 201 of the touch panel 200. Further, through a compressing process, the electrical connection between the electrodes 101 and 201 on the two boards is formed by conductive particles 301 existed in the anisotropic conductive film 300.

After the compressing process for connecting the flexible printed circuit board together with the touch panel, it is needed to further check whether the electrodes 101 and 201 on the two boards are electrically connected or not. In common practice, whether the electrodes 101 and 201 on the two boards are electrically connected is determined by using a microscope to observe whether the electrodes 101 and 201 arranged on the two boards are completely in contact with conductive particles 301 or not. However, operation of the checking process is not convenient, and the observation done with the microscopic may result in massive deviations.

SUMMARY OF THE DISCLOSURE

The present disclosure provides an electrical connection assembly and a testing method thereof to overcome the above problems.

The electrical connection assembly comprises a first circuit board and a second circuit board. The first circuit board has a plurality of first signal electrodes and at least one first test electrode, wherein the first signal electrodes and the first test electrode are arranged in a spaced manner on the same side of the first circuit board. The second circuit board has a plurality of second signal electrodes and at least one second test electrode, wherein the second signal electrodes and the second test electrode are arranged in a spaced manner on the same side of the second circuit board. The first signal electrodes are electrically connected to the second signal electrodes. The first test electrode is electrically connected to the second test electrode to form a testing loop.

The testing method comprises the steps of: (a) connecting the first circuit board with the second circuit board; and (b) determining whether the first signal electrodes and the second signal electrodes are electrically connected to each other by detecting whether the testing loop formed by the first test electrode and the second test electrode is a short circuit or an open circuit.

According to the present disclosure, test electrodes are added on the first circuit board and the second circuit board of the electrical connection assembly respectively to form a testing loop. Whether the first signal electrodes and the second signal electrodes are electrically connected to each other is determined by detecting whether the testing loop is a short circuit or an open circuit. Thus, the connection reliability of the electrical connection assembly is improved and determining whether the first board and the second board of the electrical connection assembly are electrically connected is more convenient.

DETAILED DESCRIPTION OF THE EMBODIMENTS

The following description is made for the purpose of illustrating the general principles of the invention and should not be taken in a limiting sense. The scope of the invention is determined by reference to the appended claims.

An electrical connection assembly is disclosed in the present embodiment. An electrical connection assembly comprises a first circuit board and a second circuit board. The first circuit board has a plurality of first signal electrodes and at least one first test electrode, and the first signal electrodes and the first test electrode are arranged in a spaced manner on the same side of the first circuit board. The second circuit board has a plurality of second signal electrodes and at least one second test electrode, and the second signal electrodes and the second test electrode are arranged in a spaced manner on the same side of the second circuit board. The first signal electrodes are electrically connected to the second signal electrodes, and the first test electrode is electrically connected to the second test electrode to form a testing loop. In this way, whether the first signal electrodes and the second signal electrodes are electrically connected to each other is determined by detecting whether the testing loop is a short circuit or an open circuit. For example, when the testing loop is a short circuit, the first signal electrodes are electrically connected to the second signal electrodes. On the contrary, when the testing loop is an open circuit, the first signal electrodes are not electrically connected to the second signal electrodes. Thus, the connection reliability of the electrical connection assembly is improved and determining whether the first circuit board and the second circuit board of the electrical connection assembly are electrically connected becomes more convenient.

Figure 1:
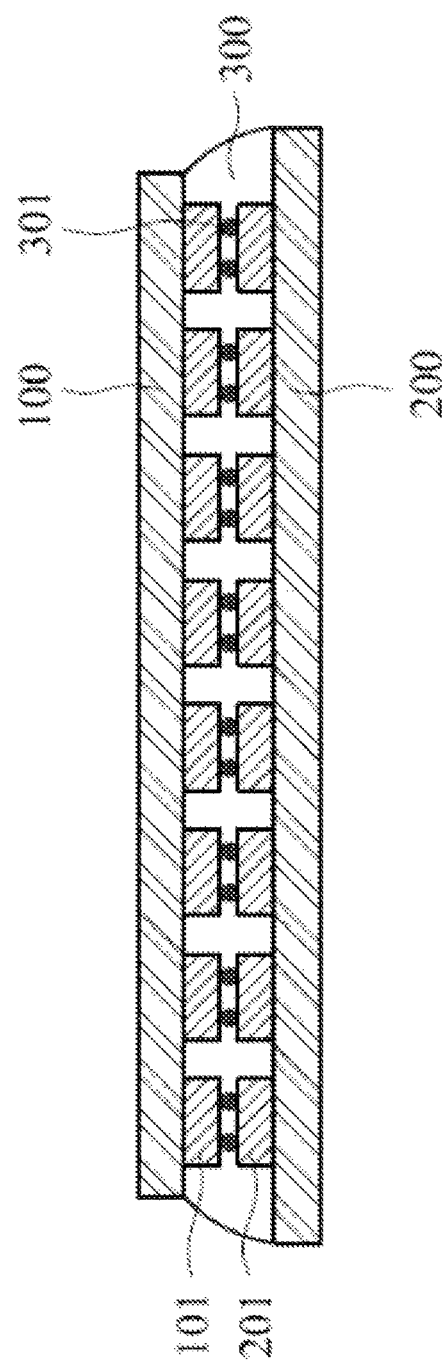
FIG. 1 is cross section of a connection between a flexible printed circuit board and a touch panel in a conventional touch display device.
Figure 2A:
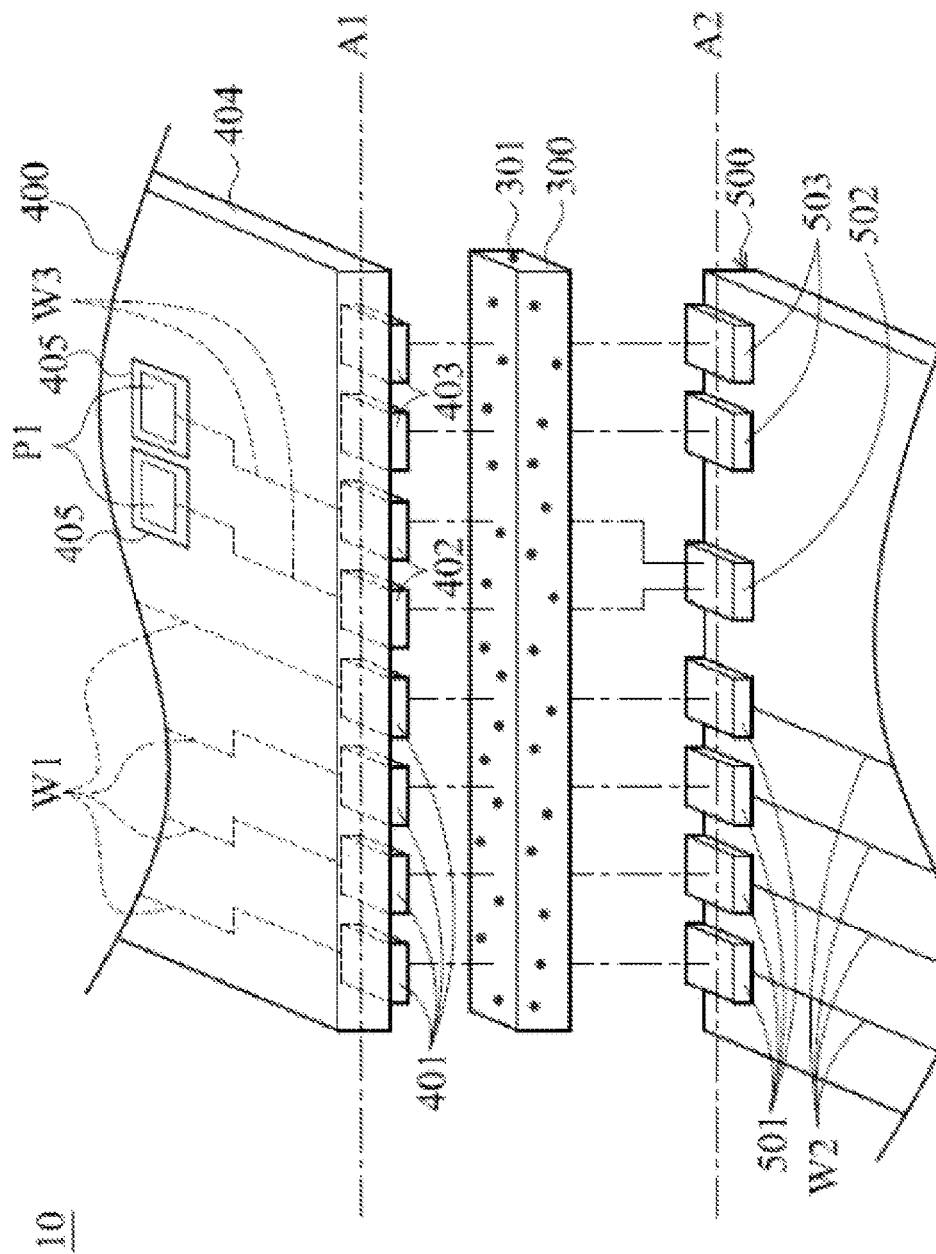
FIG. 2A is an exploded view of an electrical connection assembly according to the first embodiment of the present disclosure.

FIG. 2A is an exploded view of an electrical connection assembly according to the first embodiment of the present disclosure. Please refer to FIG. 2A. In an embodiment of the present disclosure, an electrical connection assembly 10 includes a first circuit board 400 and a second circuit board 500. The first circuit board 400 in the present embodiment not only has a plurality of first signal electrodes 401 but also has two first test electrodes 402. The second circuit board 500 not only has a plurality of second signal electrodes 501 but also has at least one second test electrode 502. In the present embodiment, the amount of the second test electrode 502 is one. The first signal electrodes 401 and the first test electrodes 402 are located on the same side of the first circuit board 400 and are arranged in a spaced manner along a first axis A1. Similarly, the second signal electrodes 501 and the second test electrode 502 are located on the same side of the second circuit board 500 and are arranged in a spaced manner along a second axis A2. The first axis A1 and the second axis A2 are parallel with each other. In addition, the first signal electrodes 401 are arranged to be opposite to the second electrodes 501, and the first test electrodes 402 are arranged to be opposite to the second test electrode 502.

Positions of the first signal electrodes 401 correspond to positions of the second signal electrodes 501, respectively, and the first signal electrodes 401 are electrically connected to the corresponding ones of the second signal electrodes 501. Further, the position of the second test electrode 502 corresponds to the two first test electrodes 402 at the same time, and the second test electrode 502 is electrically connected to the two first test electrodes 420 at the same time, such that the first test electrodes 402 and the second test electrode 502 form a testing loop, and the electrical connection between the first signal electrodes 401 and the second signal electrodes 501 are determined by testing the testing loop through a detecting circuit (not shown). For example, the detecting circuit can be a multimeter. In another embodiment, for convenience of detecting, the first circuit board 400 has two first test wires W3 and two first test connection nodes P1. The first test electrodes 402 are respectively connected to the first test connection nodes P1 through the corresponding ones of the first test wires W3. The two terminals of the detecting circuit (i.e., multimeter) are respectively contacted with the two first test connection nodes P1 to detect whether the testing loop is a short circuit or an open circuit.

Moreover, in another embodiment, the first circuit board 400 further includes a first protection layer 404, covering the first signal electrodes 401, the first test electrodes 402, the first test wires W3 and the first test connection nodes P1, in order to prevent erosion from the environment to the first signal electrodes 401, the first test electrodes 402, the first test wires W3 and the first test connection nodes P1. The detecting circuit (i.e., multimeter) can be arranged to directly pierce the first protection layer 404 to contact the first test connection nodes P1 and detect whether the testing loop is a short circuit or an open circuit, when the material of the first protection layer 404 is soft and the degree of transparency is high. However, when the material of the first protection layer is hard and transparency is poor, it is not easy to find out the locations of the first test connection nodes P1. Thus, the first protection layer 404 can further have a plurality of first openings 405, and the positions of the first openings 405 correspond to the positions of the first test electrode nodes P1, wherein at least part of the first test connection node P1 is exposed for detection, such that the detecting circuit (i.e., multimeter) can detect the testing loop by directly touching the first test connection nodes P1. Hence, it is more convenient to detect the testing loop. Additionally, the first test connection nodes P1 can be arranged on the locations which are not covered by the first protection layer 404 through the extension of the first test wires W3. In order to insure that the contact area of the first test connection node P1 and the detecting circuit (i.e., multimeter) is enough, the diameter of the first test connection node P1 is larger than the diameter of the first test wire W2, and the diameter of the first test connection P1 is larger than 0.5 mm in a preferred embodiment.

Further, in another embodiment, the first circuit board 400 further includes at least a first dummy electrode 403, and the dummy electrode is not electrically connected to a controlling circuit or a functional circuit. The first dummy electrode 403, the first signal electrode 401 and the first test electrode 402 are arranged in a spaced manner along the first axis A1. The second circuit board 500 further includes at least a second dummy electrode 503, wherein the second dummy electrode 503, the second signal electrode 501 and the second test electrodes 502 are arranged in a spaced manner along the second axil A2. In the present embodiment, the amount of the first dummy electrodes 403 and the second dummy electrodes 503 are two, but it is not limited thereto, only the positions of the first dummy electrodes 403 need to correspond to the positions of the second dummy electrodes 503. By the arrangement of the first dummy electrodes 403 and the second dummy electrodes 503, not only the connection ability of the first circuit board 400 and the second circuit board 500 is increased, but also the possibility of the height differences between the areas with the signal electrodes and the areas without signal electrodes on the first circuit board 400 and the second circuit board 500 is reduced. Thus, the connection between the first circuit board 400 and the second circuit board 500 is smoother.

Please refer to FIG. 2A. The electrical connection assembly 10 further includes a plurality of first signal wires W1 and a plurality of second signal wires W2, wherein the first signal wires W1 are electrically and respectively connected to the first signal electrodes 401, and the second signal wires W2 are electrically and respectively connected to the second signal electrodes 501. For example, when the first circuit board 400 is a flexible printed circuit board and the second circuit board 500 is a touch panel, the first signal wires W1 are used to connect the first signal electrodes 401 on the flexible printed circuit board to a controller (not shown), while the second signal wires W2 are used to connect the second signal electrodes 501 on the touch panel to sensing electrodes (not shown) of the touch panel.

Furthermore, an anisotropic conductive film 300 can also be arranged between the first circuit board 400 and the second circuit board 500, and a plurality of conductive particles 301 existed in the anisotropic conductive film 300 are arranged to provide the electrical conductivity between the electrodes of the two circuit boards 400 and 500. When the first circuit board 400 and the second circuit board 500 are compacted or compressed together, the first test electrodes 402 are in contact with the second test electrode 502 to form a test loop through the conductive particles 301, and then the first test electrode 402 can be connected to a detecting circuit to detect whether the testing loop is a short circuit or an open circuit.

Figure 2B:
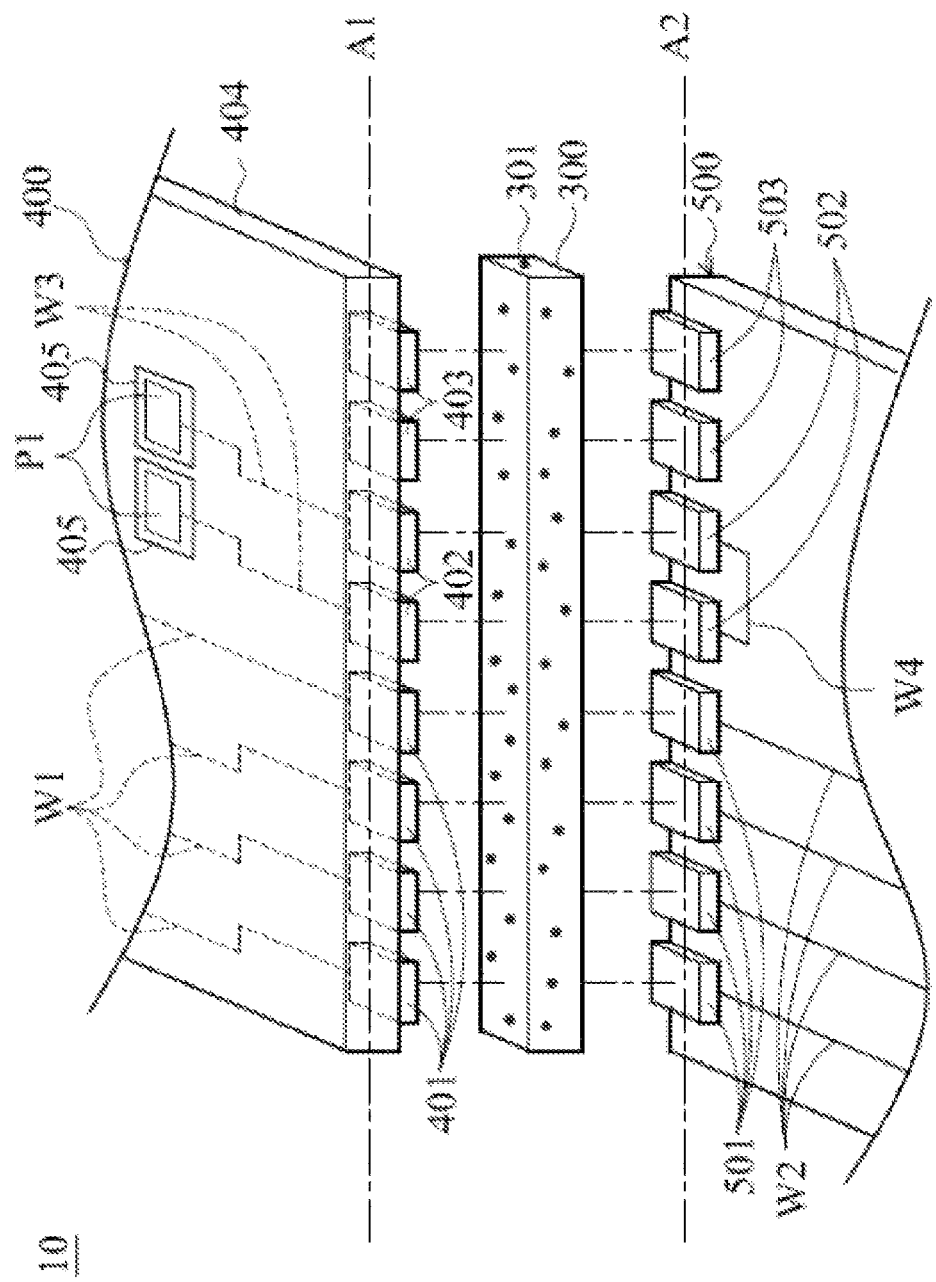
FIG. 2B is an exploded view of an electrical connection component according to the second embodiment of the present disclosure.

FIG. 2B is an exploded view of an electrical connection assembly of the second embodiment. Please refer to FIG. 2B. The difference between the present embodiment and the first embodiment is that a plurality of second test electrodes 502 are arranged on the second circuit board 500. The two second test electrodes 502 are taken as examples. The locations of the two second test electrodes 502 are respectively corresponding to the locations of two first test electrodes 402 of the first circuit board 400, and the two second test electrodes 502 are electrically connected through a second test wire W4 on the second circuit board 500. The first test electrodes 402 are connected to the second test electrodes 502 to form a testing loop through the anisotropic conductive film 300, when the first circuit board 400 is connected to the second circuit board 500. Whether the first signal electrodes 401 and the second signal electrodes 501 are electrically connected to each other is determined by detecting whether the testing loop is a short circuit or an open circuit. In the present embodiment, two second test electrodes 502 arranged on the second circuit board 500 respectively correspond to two first test electrodes 402 arranged on the first circuit board 400, such that determining whether the first signal electrodes 401 and the second signal electrodes 501 are electrically connected to each other by detecting whether the testing loop is a short circuit or an open circuit is more accurate. In another embodiment, the amount of the second test electrodes 502 can be larger than two. When the amount of the second test electrodes 502 is greater than two, the second test electrodes 502 are electrically connected to each other through the plurality of the second test wires W4, and the amount of the first test electrodes 402 correspond to the amount of the second test electrodes 502. It is noted that the similar or same parts described in the first embodiment will not be described again in the present embodiment for briefly.

Figure 3:
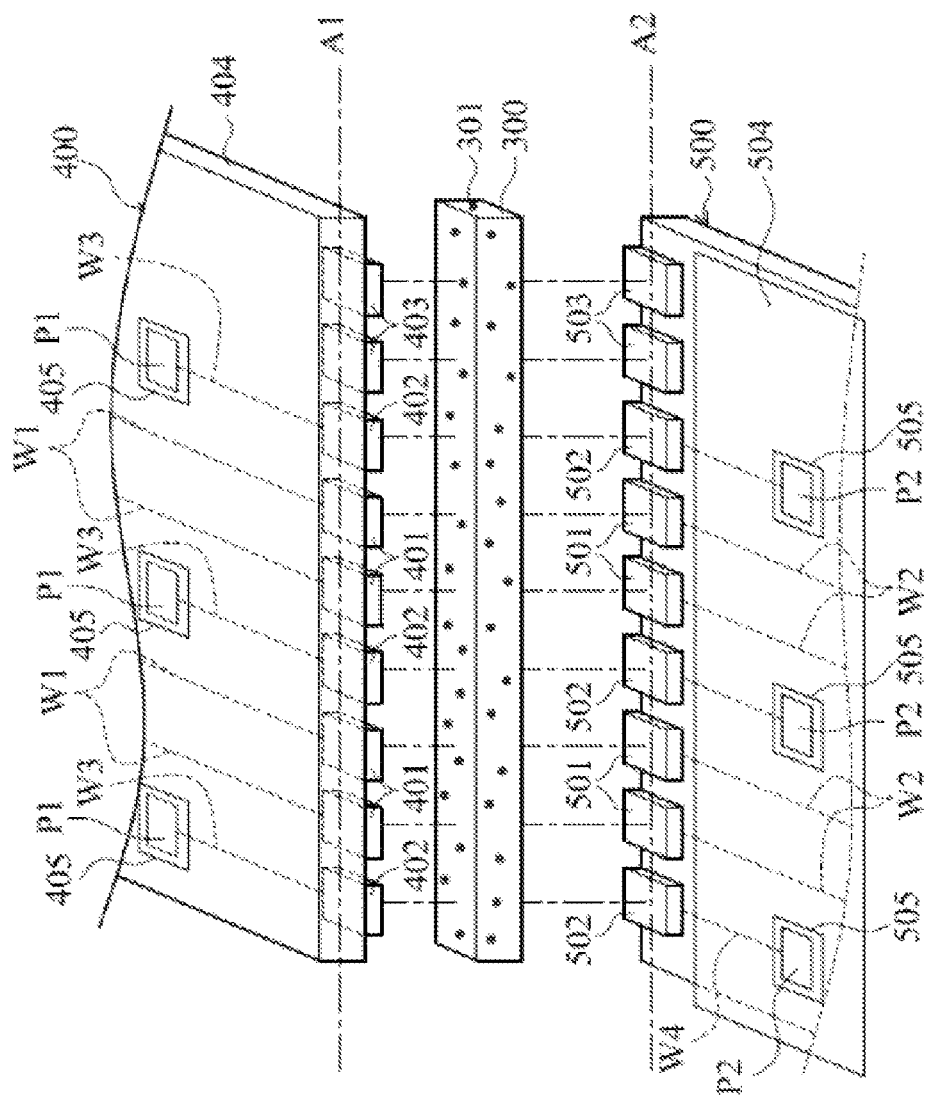
FIG. 3 is an exploded view of an electrical connection assembly according to the third embodiment of the present disclosure.

FIG. 3 is an exploded view of an electrical connection assembly of the third embodiment of the present disclosure. Please refer to FIG. 3. In the third embodiment of the present disclosure, the first circuit board 400 and the second circuit board 500 of the electrical connection assembly 10 further include at least one pair of a first test electrode 402 and second test electrode 502 arranged opposite to each other. The difference between the present embodiment and the first embodiment is that the amount of the first test electrodes 402 and the second test electrodes 502 are both plural, and the first test electrodes 402 and the first signal electrodes 401 are alternately arranged. The amount of the second test electrodes 502 and the first test electrodes 402 are the same and the positions of the second test electrodes 502 correspond to the positions of the first test electrodes 402. The second test electrodes 502 and the second signal electrodes 501 are alternately disposed. The first test electrodes 402 are electrically connected to the corresponding ones of the second electrodes 502 to form a plurality of testing loops, respectively. In the present embodiment, the three first test electrodes 402 and three second test electrodes 502 are taken as examples. The three first test electrodes 402 are respectively arranged on the left side, the right side and the center of the four first signal electrodes 401, and the three second test electrodes 502 are respectively arranged on the left side, the right side and the center of the four second electrodes 502. In this way, when the first circuit board 400 and the second circuit board 500 are compressed together, the three first test electrodes 402 are connected to the three second electrodes 502 through the anisotropic conductive film 300 to respectively form three testing loops. In addition, whether the first signal electrodes 401 and the second signal electrodes 501 are electrically connected to each other is determined by detecting whether the testing loop is a short circuit or an open circuit. Such approach can fully detect whether the first electrodes 402 and the second electrodes 502 are electrically connected in each regions.

Furthermore, the amount of the first test electrodes 402 and second electrodes 502 are not limited to three, and the arranged positions are not limited to being the left side, the right side and the center of the first signal electrodes 401 and the second electrodes 501. However, the amounts and locations of the first test electrodes 402 correspond to those of the second test electrodes 502. For example, the amount of the first test electrode(s) 402 and second test electrode(s) 502 can be singular or plural (includes two, three or more), and the first test electrode(s) 402 and second test electrode(s) 502 are arranged at the left side, the right side, the center or one of the groups of a combination of any other one of the locations of the first signal electrodes 401 and the second signal electrodes 501.

Please refer to FIG. 3, wherein the first circuit board 400 further includes three first test wires W3 and three first test connection nodes P1, and the first test electrodes 402 are electrically connected to the corresponding ones of the first test connection nodes P1 through the first test wires W3. In addition, the second circuit board 500 further includes three second test wires W4 and three second test connection nodes P2, and the second test electrodes 502 are electrically connected to the corresponding ones of the second test connection nodes P2 through the second test wires W4. In this way, whether the three test loops are short circuits or open circuits can be easily detected by electrically connecting the detecting circuit with the first test connection nodes P1 and the second test connection nodes P2. Furthermore, whether the first signal electrodes 401 and the second electrodes 501 are electrically connected to each other can also be determined by electrically connecting the detecting circuit with the first test connection nodes P1 and the second test connection nodes P2.

Please refer to FIG. 3, in another embodiment, the first circuit board 400 further includes a first protection layer 404, covering the first signal electrodes 401, the first test electrodes 402, the first test wires W3 and the first test connection node P1. The second circuit board 500 further includes a second protection layer 504, covering the second test wires W2 and the second test connection nodes P2 in order to prevent the above components suffering the environmental erosion. It is noted that because the second signal electrodes 501 and the second test electrodes 502 need to be electrically connected to the first signal electrodes 401 and the first test electrodes 402 respectively, the second protection layer 504 does not fully cover the second signal electrodes 501 and the test electrodes 502. The detecting circuit (i.e., multimeter) directly pierces the first protection layer 404 to contact the first test connection node P1 and then to detect whether the testing loop is a short circuit or an open circuit when the material of the first protection layer 404 is soft and the degree of the transparency is high. However, when the material of the first protection layer is hard and transparency is poor, the first protection layer 404 can further have a plurality of first openings 405, and the locations of the first openings 405 correspond to positions of the first test connection node P1 and at least a part of the first test connection node P1 is exposed. The second protection layer 502 further includes the second openings 505, and the locations of the second openings 505 correspond to those of the second test connection node P2, and at least a part of the second test connection node P2 is exposed such that the detecting circuit (i.e., multimeter) can directly touch the first and second test connection nodes P1 and P2. Thus, the testing method is more convenient. It should be noted that in order to ensure that the contact area of the first and second test connection node P1 and P2 and the detecting circuit (i.e., multimeter) is large enough, the diameters of the first and second test connection node P1 and P2 are larger than the diameters of the first and second test wire W3 and W4, and the diameters of the first and second test connection nodes P1 and P2 are larger than 0.5 mm in a preferred embodiment. Additionally, the first test connection nodes P1 can be arranged on the locations which are not covered by the first protection layer 404 through the extension of the first test wires W3 while the second test connection nodes P2 can be arranged on the locations which are not covered by the second protection layer 504 through the extension of the second test wires W4. In this way, the detection with the detecting circuit (i.e., multimeter) is processed by direct contact with the first test connection nodes P1 and the second test connection nodes P2. The similar or same parts described in the first embodiment will not be described again in the present embodiment for briefly.

The first signal electrodes 401 and the first test electrodes 402 are formed in the same process and have the same structure (length, width and depth etc.), while the second signal electrodes 501 and the second test electrodes 502 are formed in the same process and have the same structure (length, width and depth etc.). Materials of the first signal electrodes 401, the first test electrodes 402, the second signal electrodes 501, the second test electrodes 502, the first dummy electrodes 403, the second dummy electrodes 503, the first test wires W3 and the second test wires W4 are conductive materials, which include metal or alloy, such as copper, molybdenum, chromium, titanium, molybdenum, and niobium alloy formed by punching, cutting or printing or sputtering and etching. Materials of the first protection layer 404 and the second protection layer 502 can be an organic or inorganic insulating material, including polyimide, polyethylene terephthalate, silicon dioxide or silicon nitride.

As mentioned above, the test electrodes 402 and 502 and the dummy electrodes 403 and 503, which have the same structure as the signal electrodes 401 and 501, are arranged on the first circuit board 400 and the second circuit board 500. Therefore, the spaces, which are not arranged with the signal electrodes 401 and 501, on the first circuit board 400 and the second circuit board 500 can be occupied by the test electrodes 402 and 502 and the dummy electrodes 403 and 503, such that the possibility of the height differences between the area arranged with the signal electrode and the area which is not arranged with the signal electrode are reduced. In this way, the non-uniform stress generated by the conventional compressing process is improved. Furthermore, whether the first signal electrodes 401 and the second signal electrodes 501 are electrically connected to each other can be determined by detecting whether the testing loop formed by the first test electrode(s) 402 and the second test electrode(s) 501 is a short circuit or an open circuit.

Specifically, if at least one testing loop between the first test electrodes 402 and the second test electrodes is an open circuit, it means that the compression between the first circuit board 400 and the second circuit board may have some problems. Therefore, the first signal electrodes 401 and the second signal electrodes 501 cannot be connected to transmit electrical signals through the conductive particles 301. Conversely, if the testing loops formed between the first test electrodes 402 and the second test electrodes are short circuits, it means that the compression between the first circuit board 400 and the second circuit board 500 is appropriate, and it can be determined that the first signal electrodes 401 are electrically connected to the second signal electrodes 502.

Figure 4:
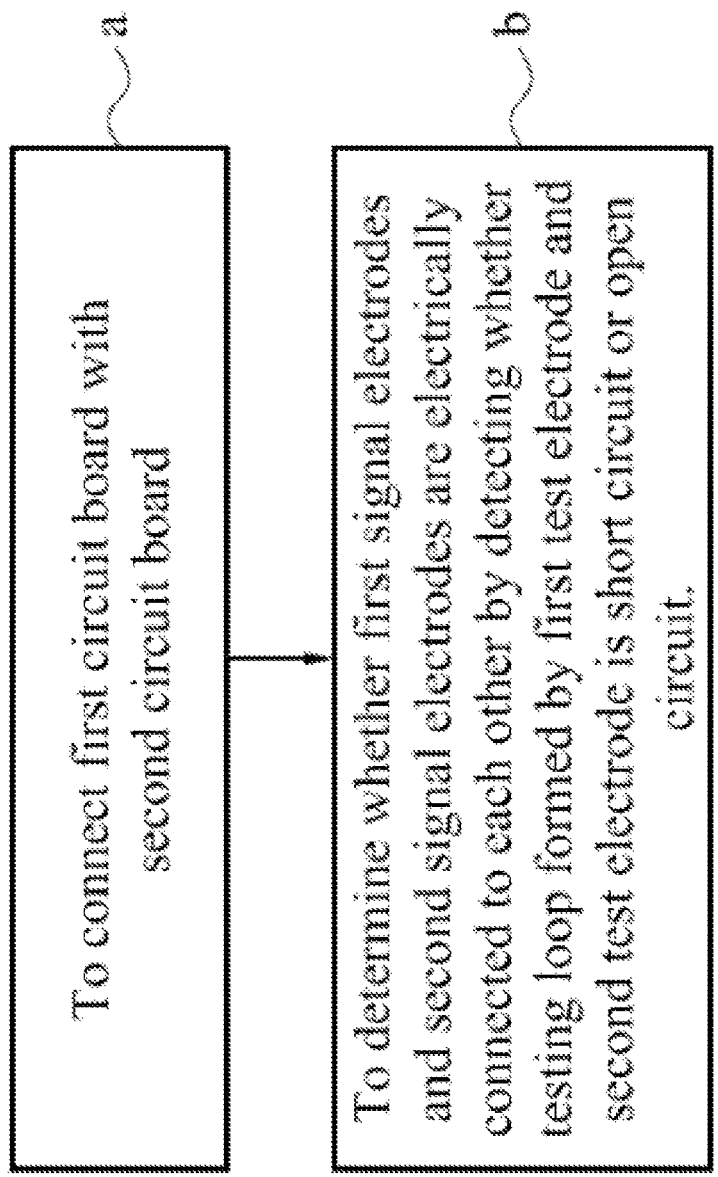
FIG. 4 is a flowchart of a testing method of an electrical connection assembly according to an embodiment of the present disclosure.

A testing method of an electrical connection assembly is disclosed, and the testing method is configured to detect the connection between the first circuit board 400 and the second circuit board 500. FIG. 4 is a flowchart of the testing method of an electrical connection assembly in an embodiment of the present disclosure. Please refer to FIG. 4. The testing method includes the steps of: (a) connecting the first circuit board 400 to the second circuit board 500; and step (b) determining whether the first signal electrodes 401 on the first circuit board 400 and the second signal electrodes 501 on the second circuit board 500 are electrically connected to each other by a detecting circuit (i.e., multimeter) to detect whether at least one testing loop formed by the first test electrode(s) 402 and the second test electrode(s) 502 is a short circuit or an open circuit.

Further, the step (a) comprises connecting the first and second signal electrodes 401 and 501 together through an anisotropic conductive film 300, and also connects the first test electrode 402 and the second test electrode 502 through the anisotropic conductive film 300. The anisotropic conductive film 300 has a plurality of conductive particles 301, and the first test electrodes 402 are connected to the second test electrodes 502 to form at least one testing loop through the conductive particles 301. The first test electrodes 402 are connected to the detecting circuit to determine whether the testing loops(s) is/are short circuit(s) or open circuit(s).

The step (b) further comprises determining whether the testing loop is a short circuit or an open circuit, and it is determined that the first signal electrodes 401 and the second signal electrodes 501 are electrically connected to each other when the testing loop is a short circuit; otherwise, it is determined that the first signal electrodes 401 and the second signal electrodes 501 are not electrically connected to each other.

In the above embodiments, the first circuit board 400 and the second circuit board 500 can be two electrical elements, and, more specifically, they can be a flexible printed circuit board and a touch panel respectively, or a liquid crystal display panel and an integrated circuit chip respectively, or a flexible printed circuit board and a printed circuit board respectively etc.

In summary, the electrical connection assembly and the testing method thereof are disclosed according to the embodiments of the present disclosure. Whether the electrodes on the first circuit board 400 are electrically connected to the electrodes on the second circuit board 500 is determined by adding the corresponding test electrodes to the first test board 400 and to the second board 500, and by using a test instrument instead of observation by a human to detect the electrical connection between the electrodes. Thus, the connection reliability of the electrical connection assembly is improved and determining whether the first circuit board 400 and the second board 500 of the electrical connection assembly are electrically connected is more convenient. Further, the spaces, which are not arranged with the signal electrodes, on the first circuit board and the second circuit board can be occupied by the test electrodes and the dummy electrodes, such that the possibility of the height differences between the areas arranged with the signal electrodes and the areas which are not arranged with the signal electrodes are reduced. In this way, the non-uniform stress generated by the conventional compressing process is improved.

While certain embodiments have been shown and described, various modifications and substitutions may be made thereto without departing from the spirit and scope of the disclosure. Therefore, it is to be understood that the present disclosure has been described by way of illustration and not limitations.

What is claimed is:
1. An electrical connection device, comprising:
  a first circuit board, having a plurality of first signal electrodes and at least one first test electrode, wherein the first signal electrodes and the first test electrode are arranged in a spaced manner on a same side of the first circuit board; and a second circuit board, having a plurality of second signal electrodes and at least one second test electrode, wherein the second signal electrodes and the second test electrode are arranged in a spaced manner on a same side of the second circuit board, wherein the first signal electrodes are electrically connected to the second signal electrodes, and the first test electrode is electrically connected to the second test electrode to form a testing loop;

wherein the first test electrode and the second test electrode are configured to determine whether the first signal electrodes and the second signal electrodes are electrically connected to each other by detecting whether the testing loop is a short circuit or an open circuit.

2. The electrical connection device as claimed in claim 1, wherein an amount of the first test electrodes is plural, an amount of the second test electrode is one, and the first test electrodes and the second test electrode are electrically connected to form the testing loop.

3. The electrical connection device as claimed in claim 1, wherein an amount of the first test electrodes and the second test electrodes are both plural, the electrical connection device further comprises at least one second test wire, the second test electrodes are electrically connected to each other through the second test wire, and the second test electrodes are electrically connected to a corresponding one of the first test electrodes to form the testing loop.

4. The electrical connection device as claimed in claim 1, wherein an amount of the first test electrodes and the second test electrodes are both plural, the first test electrodes and the first signal electrodes are alternatively disposed, an amount of the first test electrodes and an amount of the second test electrodes are equal and locations of the first test electrodes correspond to locations of the second test electrodes, and the second test electrodes and the second signal electrodes are alternatively disposed, wherein the first test electrodes are connected to a corresponding one of the second test electrodes to form a plurality of testing loops.

5. The electrical connection device as claimed in claim 2, wherein the first circuit board further comprises a plurality of first test wires and a plurality of first test connection nodes, and the first test electrodes are electrically connected to a corresponding one of the first test connection nodes through a corresponding one of the first test wires.

6. The electrical connection device as claimed in claim 3, wherein the first circuit board further comprises a plurality of first test wires and a plurality of first test connection nodes, and the first test electrodes are electrically connected to a corresponding one of the first test connection nodes through a corresponding one of the first test wires.

7. The electrical connection device as claimed in claim 4, wherein the first circuit board further comprises a plurality of first test wires and a plurality of first test connection nodes, and the first test electrodes are electrically connected to a corresponding one of the first test connection nodes through a corresponding one of the first test wires, and the second circuit board further comprises a plurality of second test wires and a plurality of second test connection nodes, and the second test electrodes are electrically connected to a corresponding one of the second test connection nodes through a corresponding one of the second test wires.

8. The electrical connection device as claimed in claim 5, wherein the first circuit board further comprises a first protection layer covering the first signal electrodes, the first test electrodes, the first test wires and the first test connection nodes.

9. The electrical connection device as claimed in claim 6, wherein the first circuit board further comprises a first protection layer covering the first signal electrodes, the first test electrodes, the first test wires and the first test connection nodes.

10. The electrical connection device as claimed in claim 8, wherein the first protection layer has a plurality of first openings located at locations corresponding to locations of the first test connection nodes.

11. The electrical connection device as claimed in claim 9, wherein the first protection layer has a plurality of first openings located at locations corresponding to locations of the first test connection nodes.

12. The electrical connection device as claimed in claim 10, wherein a diameter of each of the first openings is larger than 0.5 mm.

13. The electrical connection device as claimed in claim 11, wherein a diameter of each of the first openings is larger than 0.5 mm.

14. The electrical connection device as claimed in claim 7, wherein the first circuit board further comprises a first protection layer covering the first signal electrodes, the first test electrodes, the first test wires and the first test connection nodes, and the second circuit board further comprises a second protection layer covering the second signal electrodes, the second test electrodes, the second test wires and the second test connection nodes.

15. The electrical connection device as claimed in claim 14, wherein the first protection layer has a plurality of first openings located at locations corresponding to locations of the first test connection nodes, and the second protection layer has a plurality of second openings located at locations corresponding to locations of the second test connection nodes.

16. The electrical connection device as claimed in claim 15, wherein a diameter of each of the first openings and the second openings is larger than 0.5 mm.

17. The electrical connection device as claimed in claim 1, further comprising an anisotropic conductive film disposed between the first circuit board and the second circuit board, wherein the anisotropic conductive film is configured to electrically connect the first signal electrodes to the second signal electrodes and electrically connect the first test electrode to the second test electrode.

18. The electrical connection device as claimed in claim 1, wherein the first signal electrodes and the first test electrode have a same structure, and the second signal electrodes and the second test electrode have a same structure.

19. The electrical connection device as claimed in claim 1, wherein the first circuit board is a flexible printed circuit board, and the second circuit board is a touch panel.

20. The electrical connection device as claimed in claim 1, wherein the first circuit board further comprises at least one first dummy electrode, and the first dummy electrode and the first signal electrodes are arranged in a spaced manner on the same side of the first circuit board, and the second circuit board further comprises at least one second dummy electrode, and the second dummy electrode and the second signal electrodes are arranged in a spaced manner on the same side of the second circuit board, wherein locations of the first dummy electrode correspond to locations of the second dummy electrode.

21. A testing method of the electrical connection device as claimed in claim 1, comprising the steps of:
  (a) connecting the first circuit board with the second circuit board; and
  (b) determining whether the first signal electrodes and the second signal electrodes are electrically connected to each other by detecting whether the testing loop formed by the first test electrode and the second test electrode is a short circuit or an open circuit.

22. The testing method of the electrical connection device as claimed in claim 21, wherein the step (a) further comprises:
connecting the first signal electrodes to the second signal electrodes and connecting the first test electrode to the second test electrode through an anisotropic conductive film.

23. The testing method of the electrical connection device as claimed in claim 21, wherein the step (b) further comprises:
determining whether the testing loop is electrically connected, wherein it is determined that the first signal electrodes are electrically connected to the second signal electrodes when the testing loop is electrically connected, and, it is determined that the first signal electrodes are not electrically connected to the second signal electrodes when the testing loop is not electrically connected.

* * * * *